(12) United States Patent
Fukuhara et al.

(10) Patent No.: US 12,078,925 B2
(45) Date of Patent: Sep. 3, 2024

(54) IMPRINT APPARATUS AND IMPRINT METHOD

(71) Applicant: KIOXIA CORPORATION, Tokyo (JP)

(72) Inventors: Kazuya Fukuhara, Suginami Tokyo (JP); Masaki Mitsuyasu, Yokohama Kanagawa (JP); Masato Suzuki, Yokohama Kanagawa (JP); Takuya Kono, Yokosuka Kanagawa (JP); Tetsuro Nakasugi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 4 days.

(21) Appl. No.: 17/724,281

(22) Filed: Apr. 19, 2022

(65) Prior Publication Data

US 2022/0252975 A1 Aug. 11, 2022

Related U.S. Application Data

(62) Division of application No. 15/905,310, filed on Feb. 26, 2018, now abandoned.

(30) Foreign Application Priority Data

Sep. 11, 2017 (JP) .................. 2017-174328

(51) Int. Cl.
G03F 7/00 (2006.01)
(52) U.S. Cl.
CPC .................. *G03F 7/0002* (2013.01)
(58) Field of Classification Search
CPC .................. G03F 7/0002; G03F 7/00
See application file for complete search history.

(56) References Cited

U.S. PATENT DOCUMENTS 7,517,211 B2 * 4/2009 Kruijt-Stegeman ........................
B29C 59/022
425/174.4
8,480,946 B2 7/2013 Mikami et al.
(Continued)

FOREIGN PATENT DOCUMENTS

JP 2009212449 A 9/2009
JP 2011100922 A 5/2011
(Continued)

OTHER PUBLICATIONS

Machine translation TW201245897A (Year: 2012).*
Machine translation JP2016058735A (Year: 2016).*
Japanese Office Action dated Dec. 8, 2020, mailed in counterpart Japanese Application No. 2017-174328, 8 pages (with translation).

*Primary Examiner* — Jacob T Minskey
*Assistant Examiner* — Ayne K. Swier
(74) *Attorney, Agent, or Firm* — Kim & Stewart LLP

(57) ABSTRACT

An imprint apparatus includes a moveable substrate support configured to hold a substrate having a transfer target material thereon, a template holder configured to hold a template in which a pattern, which is to be transferred to the transfer target material, is formed, a light source configured to emit light at different selectable intensities toward the transfer target material, and a controller. The controller includes a processing unit and a storage unit, and is configured to retrieve exposure conditions for the transfer target material and control the intensity, and timing of initiation, of the light output by the light source, based on the retrieved exposure conditions, such that the transfer target material is subjected to main curing after undergoing temporary curing.

18 Claims, 9 Drawing Sheets

(56) References Cited

U.S. PATENT DOCUMENTS

| | | | |
|---|---|---|---|
| 8,772,179 B2 | 7/2014 | Fukuhara et al. | |
| 9,387,607 B2 * | 7/2016 | Matsumoto | B29C 43/021 |
| 2007/0145643 A1 * | 6/2007 | Dijksman | G03F 9/7053 |
| | | | 425/150 |
| 2009/0224436 A1 | 9/2009 | Mikami et al. | |
| 2010/0233377 A1 * | 9/2010 | Aoki | B29C 59/022 |
| | | | 427/355 |
| 2011/0111593 A1 | 5/2011 | Kanno | |
| 2011/0143271 A1 | 6/2011 | Koshiba et al. | |
| 2013/0078821 A1 | 3/2013 | Furutono | |
| 2013/0207288 A1 | 8/2013 | Mikami | |
| 2014/0272174 A1 | 9/2014 | Furutono | |
| 2014/0339721 A1 | 11/2014 | Toshima et al. | |
| 2018/0074419 A1 | 3/2018 | Jung | |

FOREIGN PATENT DOCUMENTS

| | | | | | |
|---|---|---|---|---|---|
| JP | 2013069918 | A | | 4/2013 | |
| JP | 2013069921 | A | | 4/2013 | |
| JP | 2013168504 | A | | 8/2013 | |
| JP | 5398502 | B2 | | 1/2014 | |
| JP | 2014175434 | A | | 9/2014 | |
| JP | 2014241398 | A | | 12/2014 | |
| JP | 5787922 | B2 | | 9/2015 | |
| JP | 2016058735 | A | * | 4/2016 | |
| TW | 201245897 | A | * | 11/2012 | B82Y 10/00 |

* cited by examiner

FIG. 9
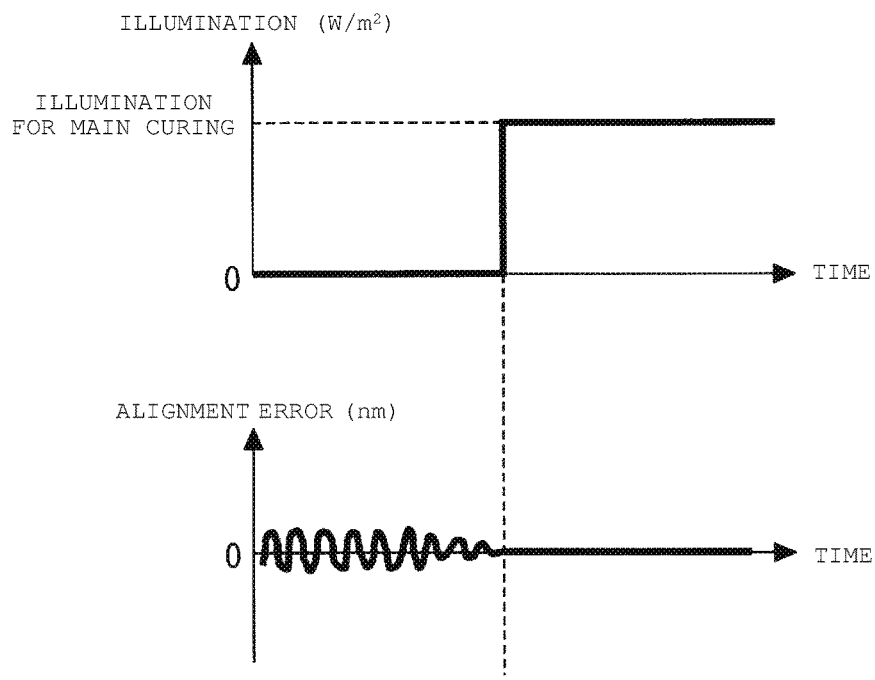
FIG. 10
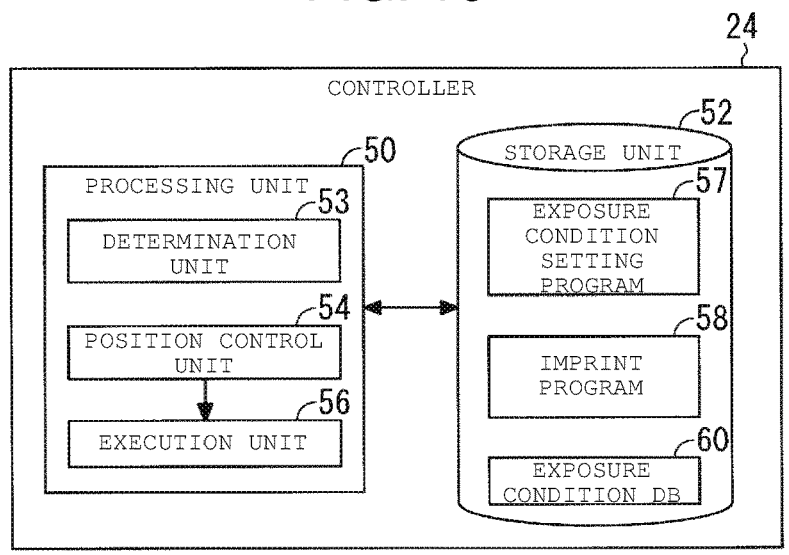
FIG. 11
| POSITION IN SUBSTRATE | EXPOSURE CONDITION |
|---|---|
| MIDDLE REGION | FIRST EXPOSURE CONDITION |
| OUTER CIRCUMFERENTIAL REGION | SECOND EXPOSURE CONDITION |

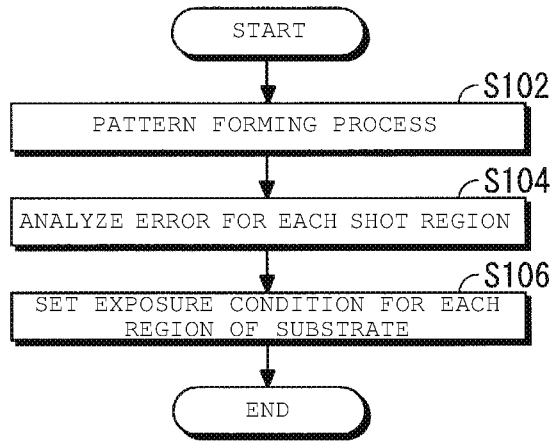
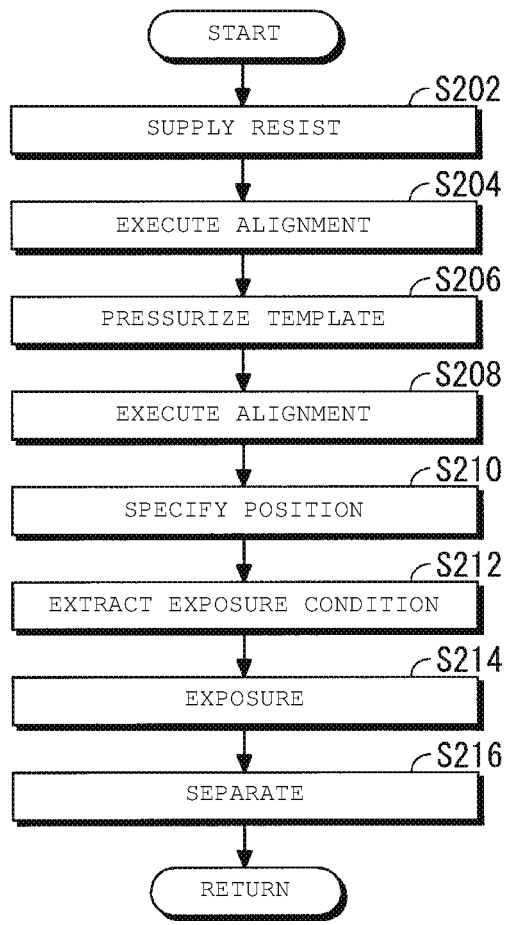

IMPRINT APPARATUS AND IMPRINT METHOD

CROSS-REFERENCE TO RELATED APPLICATIONS

This application is a division of U.S. patent application Ser. No. 15/905,310, filed on Feb. 26, 2018, which is based upon and claims the benefit of priority from Japanese Patent Application No. 2017-174328, filed Sep. 11, 2017, the entire contents of each of which are incorporated herein by reference.

FIELD

Embodiments described herein relate generally to an imprint apparatus and an imprint method.

BACKGROUND

Imprint apparatuses of the related art transfer patterns to transfer target materials such as resists. Such imprint apparatuses align templates, in which patterns are formed in advance, with substrates and cure the transfer target materials using light or the like while the patterns of the templates are in contact with the transfer target materials on the substrates. Thus, the imprint apparatuses form the patterns by transferring the patterns to the transfer target materials.

However, in the above-described imprint apparatus, an alignment error (referred to as an overlay error) between a substrate and a template increases due to a surface shape or the like of the substrate resulting from previous processing.

DESCRIPTION OF THE DRAWINGS

FIG. 9 is a graph illustrating an exposure condition of the exposure light source.
FIG. 10 is a block diagram illustrating a function of a controller.
FIG. 11 is a table illustrating an example of an exposure condition database.
FIG. 12 is a flowchart illustrating an exposure condition setting process executed by a setting unit of the controller.
FIG. 13 is a flowchart illustrating an imprint process executed by a position control unit and an execution unit of the controller.

DETAILED DESCRIPTION

Figure 1:
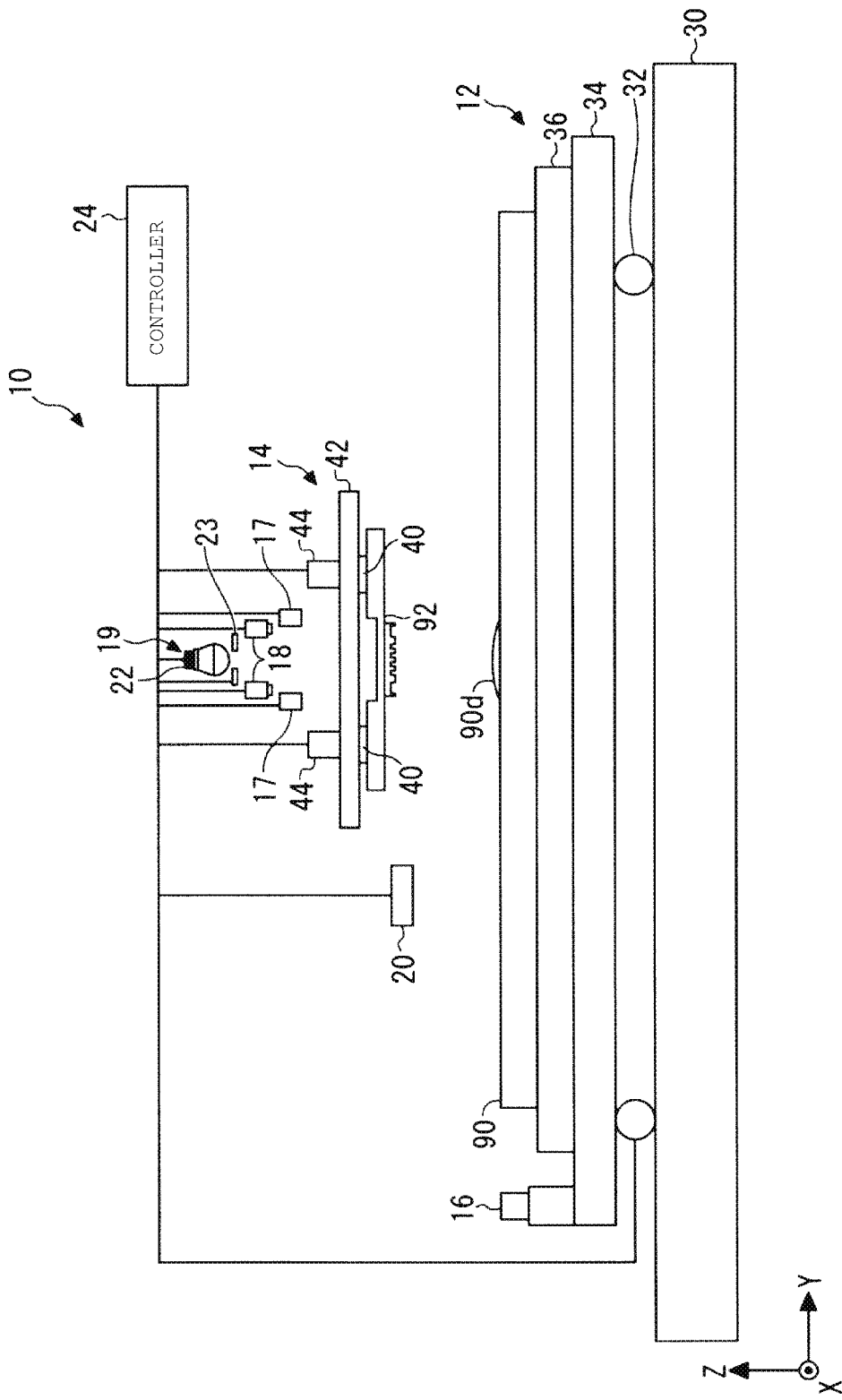
FIG. 1 is a diagram illustrating an overall configuration of an imprint apparatus according to a first embodiment.

In general, according to one embodiment, an imprint apparatus includes a moveable substrate support configured to hold a substrate having a transfer target material thereon, a template holder configured to hold a template in which a pattern, which is to be transferred to the transfer target material, is formed, a light source configured to emit light at different selectable intensities toward the transfer target material, and a controller. The controller includes a processing unit and a storage unit, and is configured to retrieve exposure conditions for the transfer target material and control the intensity, and timing of initiation, of the light output by the light source, based on the retrieved exposure conditions, such that the transfer target material is subjected to main curing after undergoing temporary curing.

In the following embodiment and modification examples, the same constituent elements are included. Accordingly, common reference numerals are given to the same constituent elements and repeated description regarding them will be omitted as appropriate. Portions in the embodiment and the modification examples can be substituted with corresponding portions in other embodiments or modification examples. Configurations, positions, or the like of portions in the embodiment and the modification examples are the same as those of other embodiments unless particularly mentioned.

First Embodiment

Figure 2:
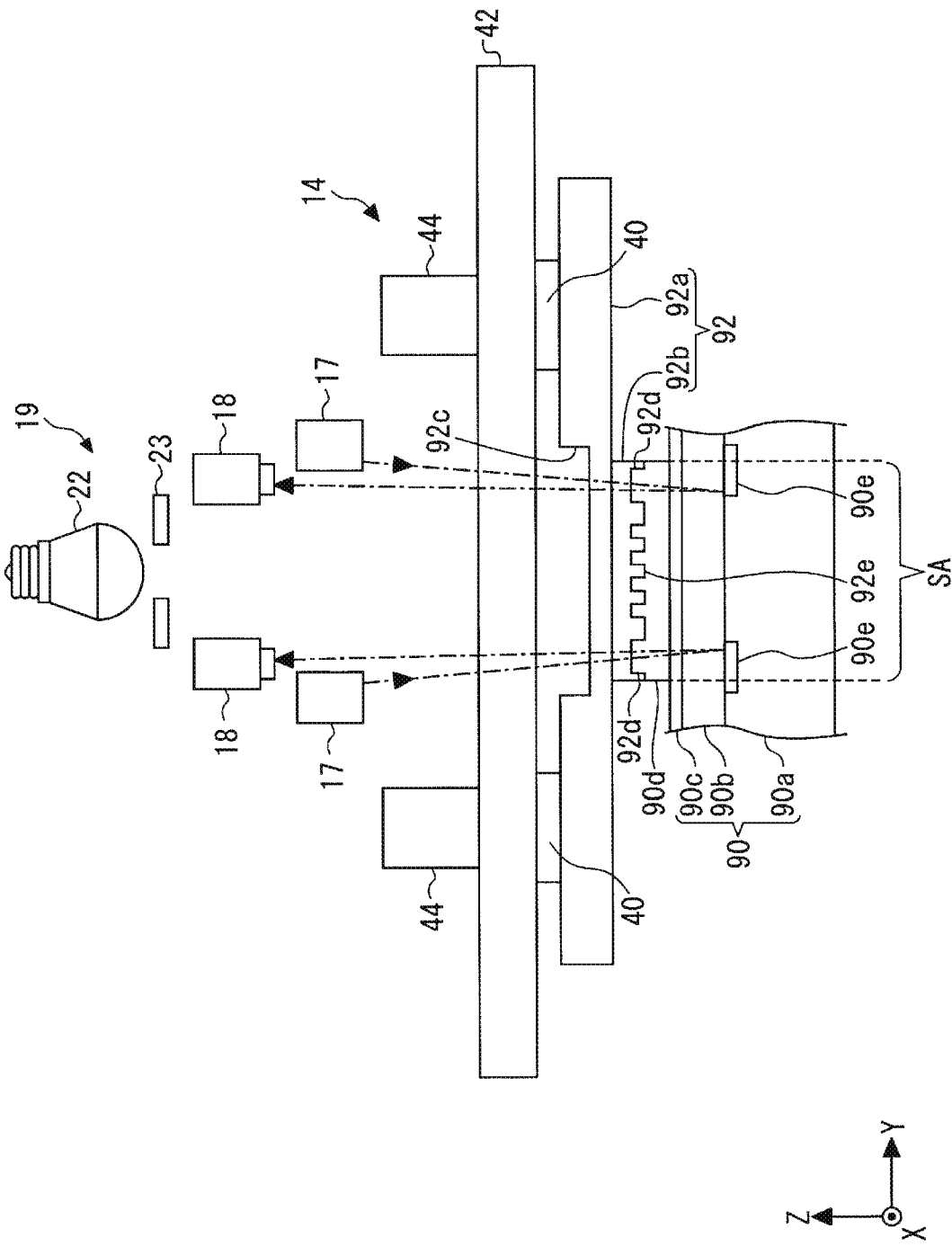
FIG. 2 is an enlarged side view illustrating the vicinity of a template holding mechanism.

FIG. 1 is a diagram illustrating an overall configuration of an imprint apparatus 10 according to a first embodiment. FIG. 2 is an enlarged side view illustrating the vicinity of a template holding mechanism 14. In FIG. 1, directions indicated by arrows are assumed to be XYZ directions of the imprint apparatus 10. The XY plane is, for example, a horizontal plane. The Z direction is, for example, a vertical direction and is a pressing direction of a pressing member 44 to be described below. FIG. 1 illustrates a state of a resist 90d on a substrate 90 before coming into contact with a template 92. FIG. 2 illustrates a state of the resist 90d on the substrate 90 when coming into contact with the template 92. The resist 90d is an example of a transfer target material.

The imprint apparatus 10 is an apparatus that transfers a pattern (for example, a nanoscale pattern) of the template 92 onto the resist 90d on the substrate 90. For example, the imprint apparatus 10 transfers the pattern to the resist 90d on the substrate 90 using an imprint method such as a light nanoimprint lithography method. As illustrated in FIGS. 1 and 2, the imprint apparatus 10 includes a substrate holding mechanism 12, the template holding mechanism 14, a reference mark 16, a plurality of alignment light sources 17, a plurality of detection units 18, a supply unit 20, a light source system 19 including an exposure light source 22 and an aperture 23, and a controller 24.

The substrate holding mechanism 12 holds the substrate 90 in which the resist 90d or the like is provided and moves the substrate 90 in the horizontal plane. The substrate holding mechanism 12 includes a stage surface plate 30, a driving mechanism 32, a substrate stage 34, and a substrate chuck 36.

The stage surface plate 30 is fixed to a floor, an apparatus stand, or the like.

The driving mechanism 32 is fixed to the upper surface of the stage surface plate 30. The driving mechanism 32 moves the substrate stage 34 while holding the substrate stage 34. The driving mechanism 32 moves the substrate stage 34 in two directions intersecting each other in the horizontal plane. For example, the driving mechanism 32 moves the substrate stage 34 in the X and Y directions in the horizontal plane. The driving mechanism 32 may be configured to be able to move the substrate stage 34 in a rotation direction around the vertical direction and the vertical direction.

The substrate stage 34 is a plate-shaped member. The substrate stage 34 is installed along the horizontal plane on the upper surface of the driving mechanism 32. The substrate stage 34 holds the substrate chuck 36.

The substrate chuck 36 is held on the upper surface of the substrate stage 34. The substrate chuck 36 holds the substrate 90 on which the pattern is formed. The substrate chuck 36 holds the substrate 90, for example, by vacuum chucking.

Here, the substrate 90 will be described. The substrate 90 includes a wafer 90a, an underlying pattern 90b, and a processing target layer 90c. The wafer 90a may be, for example, a semiconductor wafer or a wafer with an insulation property. A substrate mark 90e for alignment is formed on the wafer 90a. The underlying pattern 90b is formed on the upper surface of the wafer 90a. A processing target layer 90c to which a resist 90d dropping from the supply unit 20 is applied is formed on the upper surface of the underlying pattern 90b. The processing target layer 90c may be, for example, a conductive film such as a metal film, a semiconductor film, and an insulating film.

The template holding mechanism 14 moves the template 92 in the vertical direction while holding the template 92 to press, i.e. force, the template 92 against the substrate 90. The template holding mechanism 14 includes a template chuck 40, a chuck holding member 42, and a pressing member 44.

The template chuck 40 is formed in a ring shape to surround a counterbore 92c formed in the template 92 in a plan view. A lower surface side of the template chuck 40 holds the template 92 in which a pattern to be transferred to the substrate 90 is formed. The template chuck 40 holds the upper surface of the template 92 around the counterbore 92c, for example, by vacuum chucking.

The chuck holding member 42 is a plate-shaped member. The template chuck 40 is fixed to the lower surface of the chuck holding member 42. Thus, the chuck holding member 42 holds the template chuck 40.

The pressing member 44 is directly or indirectly fixed to a top plate or a ceiling of the imprint apparatus 10. A lower end of the pressing member 44 is fixed to the upper surface of the chuck holding member 42. The pressing member 44 is, for example, an actuator that generates a pressing force in the vertical direction. The pressing member 44 presses the template 92 against and into the resist 90d on the substrate 90 along with the template chuck 40 and the chuck holding member 42.

Here, the template 92 will be described. The template 92 includes a template substrate 92a and a mesa portion 92b. The template substrate 92a is, for example, a plate-shaped member and has a rectangular shape (for example, a square shape) smaller than the chuck holding member 42 in a plan view. The template 92 is formed of quartz glass which allows light for curing the resist 90d to pass therethrough. A recessed counterbore 92c is formed on the upper surface of the template substrate 92a. The counterbore 92c has, for example, a circular shape larger than the mesa portion 92b in a plan view. The mesa portion 92b is integrally provided on the lower surface of the template substrate 92a. The mesa portion 92b is formed of, for example, the same material as the template substrate 92a. A template mark 92d for alignment and a pattern 92e such as a circuit pattern with an uneven shape to be formed on the resist 90d of the substrate 90 are formed on the lower surface of the mesa portion 92b. The size of the mesa portion 92b is substantially the same size as a shot region SA to which the pattern 92e is transferred at one time.

The reference mark 16 is a mark indicating the position of the substrate 90. For example, the reference mark 16 is fixed to the upper surface of the substrate stage 34. Thus, the relative position of the reference mark 16 with respect to the substrate 90 held by the substrate chuck 36 installed in the substrate stage 34 is fixed. The reference mark 16 is used to set a reference position of the substrate 90 during alignment of the substrate 90 with the template 92 before the template 92 comes into contact with the resist 90d of the substrate 90.

The plurality of alignment light sources 17 is disposed above the template holding mechanism 14 to surround the center of the chuck holding member 42 and the template 92. The alignment light sources 17 emit light used for alignment between the substrate mark 90e and the template mark 92d. For example, the alignment light sources 17 emit the light for alignment in a state where the resist 90d and the mesa portion 92b are superimposed and the template mark 92d and the substrate mark 90e are substantially superimposed so that the light penetrates through both the marks 92d and 90e, as indicated by a dash-dot chain line in FIG. 2.

The plurality of detection units 18 is disposed above the template holding mechanism 14 to surround the center of the chuck holding member 42 and the template 92. One detection unit 18 is disposed to correspond to one of the alignment light sources 17. For example, the number of detection units 18 is preferably the same as the number of substrate marks 90e and template marks 92d. The detection units 18 are disposed according to, for example, the positions of the substrate marks 90e and the template marks 92d. The detection units 18 function as an alignment scope that detects the substrate marks 90e and the template marks 92d to which the light is emitted from the alignment light sources 17. The detection units 18 are, for example, optical observation devices that include imaging devices such as digital cameras. The detection units 18 image the relative locations of the substrate marks 90e and the template marks 92d and output the images to the controller 24.

The supply unit 20 is installed above the substrate 90 and the substrate holding mechanism 12. The supply unit 20 supplies and applies the resist 90d in a liquid droplet form to the shot region SA on the upper surface of the substrate 90 to which the pattern 92e is to be transferred. The resist 90d is, for example, a light curable resin which cures using the wavelength of the exposure light.

The exposure light source 22 is disposed above the center of the chuck holding member 42 and the template 92. The exposure light source 22 is, for example, an ultraviolet emission lamp that emits ultraviolet light capable of curing the resist 90d. The exposure light source 22 emits exposure light toward the resist 90d through the template 92 when in contact with the resist 90d on the substrate 90 to expose the resist 90d, for example, based on an instruction from the controller 24. Thus, the exposure light source 22 transfers the pattern 92e to the resist 90d by curing the resist 90d.

The aperture 23 is installed between the exposure light source 22 and the chuck holding member 42. The aperture 23 allows a part of the light from the exposure light source 22 to pass through the chuck holding member 42 and blocks the remaining light.

The controller 24 is, for example, a computer. The controller 24 serves to generally control the imprint apparatus 10. For example, the controller 24 controls the driving mechanism 32, the alignment light sources 17, the detection units 18, the supply unit 20, the pressurization member 44, the aperture 23, and the exposure light source 22.

Specifically, the controller 24 detects the reference mark 16 and sets the reference position of the substrate 90. The controller 24 controls the driving mechanism 32 of the substrate holding mechanism 12 to move the substrate 90. The controller 24 controls the supply unit 20 to drop and apply droplets of the resist 90$d$ to the shot region SA of the substrate 90. The controller 24 acquires a captured image of the substrate mark 90$e$ and the template mark 92$d$ from the detection units 18 while the alignment light sources 17 are emitting the light, to align the positions of the substrate 90 and the template 92. The controller 24 controls the pressing member 44 to press the template 92 into the resist on the substrate 90 to which the resist 90$d$ is applied.

The controller 24 controls the exposure light source 22 based on an exposure condition determined in advance such that light for exposure is emitted to the resist 90$d$ in the shot region SA. For example, the controller 24 controls illumination of the light of the exposure light source 22 and a time from start of the alignment of the substrate 90 with the template 92 to start of the emission of the light based on desired exposure conditions. Thus, the controller 24 may execute main curing on the resist 90$d$ after executing temporary, i.e., partial, curing thereof using the light of the exposure light source 22 or may execute the main curing on the resist 90$d$ without executing the temporary curing. When temporary curing is performed, the resist 90$d$ is in a state in which its hardness is higher than that of the resist 90$d$ in the liquid droplet form supplied from the supply unit 20, and is lower than when in the state in which the resist 90$d$ is cured (hereinafter referred to as main curing), and thus some fluidity remains after temporary curing. The main curing is a state in which the fluidity of the resist 90$d$ is substantially lost or completely lost. Here, the controller 24 may control the exposure light source 22 based on a plurality of exposure conditions associated with regions of the substrate 90. Thus, the controller 24 executes the main curing on the resist 90$d$ for each region after executing the temporary curing or executes the main curing on the resist 90$d$ without substantially executing the temporary curing. The controller 24 controls the aperture 23 along with the exposure light source 22 and controls the illumination strength or intensity of the light of the exposure light source 22.

Figure 3:
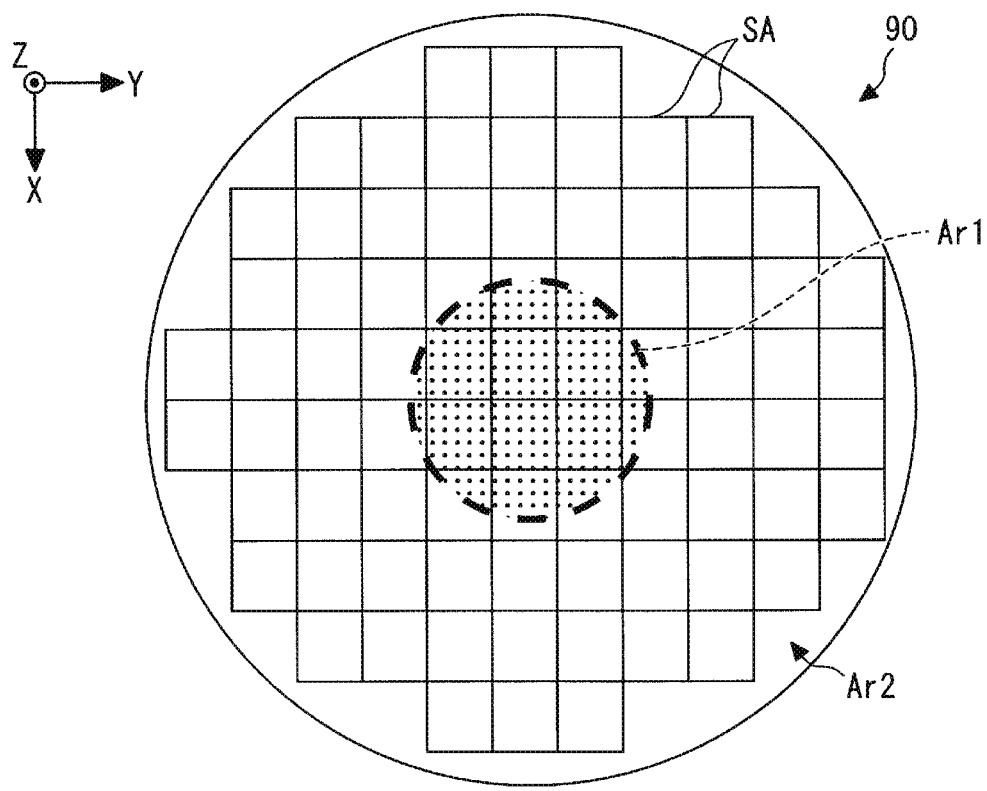
FIG. 3 is a plan view illustrating a substrate.

FIG. 3 is a plan view illustrating the substrate 90. As illustrated in FIG. 3, the substrate 90 includes a plurality of shot regions SA. The shot regions SA have a form corresponding to the mesa portion 92$b$ and each has substantially the same area. The shot regions SA are arranged on the upper surface of the substrate 90 in a matrix configuration.

Figure 4:
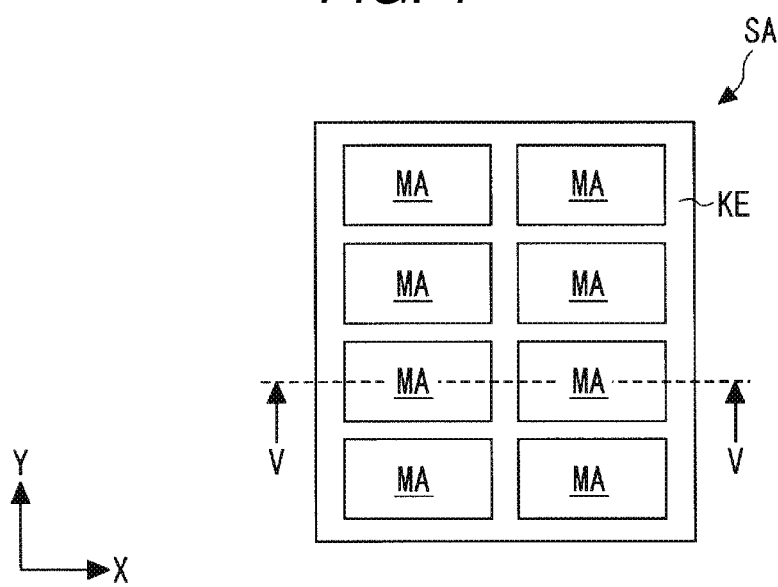
FIG. 4 is an enlarged plan view illustrating a shot region.

FIG. 4 is an enlarged plan view illustrating the shot region SA. As illustrated in FIG. 4, the shot region SA includes a plurality of main regions MA and a kerf KE region formed in the processing target layer 90$c$, e.g., an underlying three dimensional layer on the substrate. The main regions MA are arranged in a matrix configuration in the shot region SA. A pattern 92$e$ of the template 92 is formed in the main region MA. The kerf KE region is formed to surround each main region MA. The kerf KE region is a region to be diced after device in which the pattern is formed is completely formed.

Figure 5:
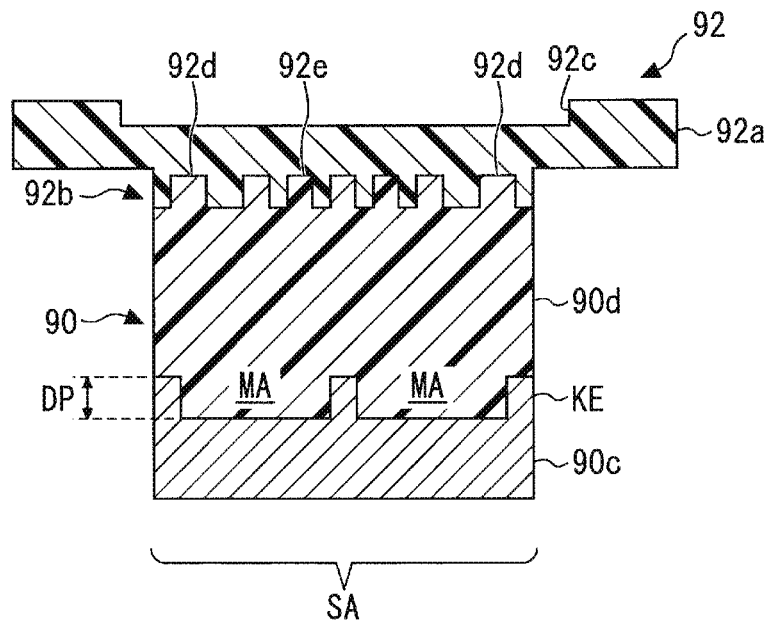
FIG. 5 is a longitudinal sectional view illustrating a processing target layer of the shot region taken along the line V-V of FIG. 4.
Figure 6:
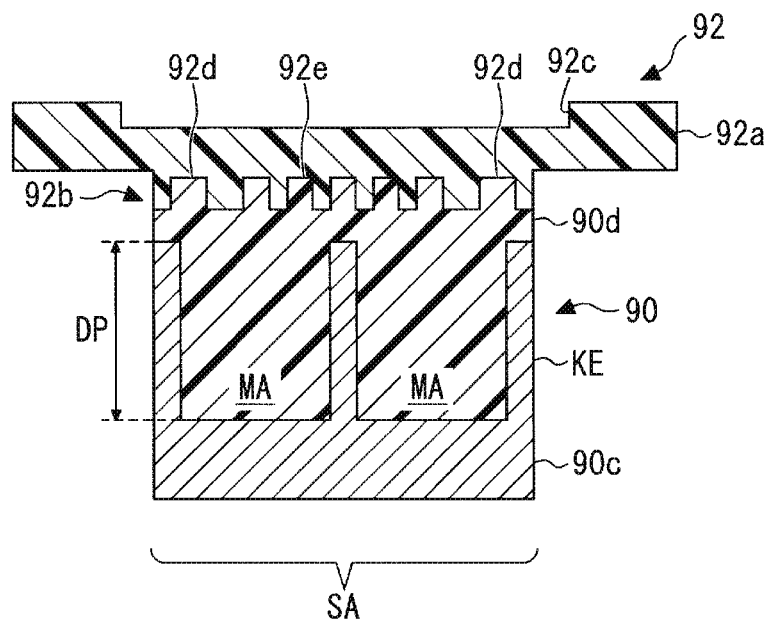
FIG. 6 is a longitudinal sectional view illustrating a processing target layer of the shot region taken along the line V-V of FIG. 4.

FIGS. 5 and 6 are longitudinal sectional views illustrating the processing target layer 90$c$ of the shot region SA taken along the line V-V of FIG. 4. In FIGS. 5 and 6, the template 92 and the resist 90$d$ are shown. FIG. 5 is an example of a longitudinal sectional view illustrating the shot region SA near a middle region Ar1 of the substrate 90 illustrated in FIG. 3. FIG. 6 is an example of a longitudinal sectional view illustrating the shot region SA in an outer circumferential region Ar2 of the substrate 90. The middle region Ar1 and the outer circumferential region Ar2 are examples of a plurality of regions. The middle region Ar1 and the outer circumferential region Ar2 of the substrate 90 illustrated in FIG. 3 are merely examples, and may be changed in accordance with processing conditions or the like of the processing target layer 90$c$. As illustrated in FIGS. 5 and 6, the main region MA is formed having a recessed shape extending into the processing target layer 90$c$. The height DP of the side wall of the kerf KE, or the depth of the recess, in the middle region Ar1 of the substrate 90 illustrated in FIG. 5 is shallower than the height DP of a side wall of the kerf KE, or the depth of the recess, in the outer circumferential region Ar2 illustrated in FIG. 6. For example, the depth DP of the outer circumferential region Ar2 is equal to or greater than several times than the depth DP of the middle region Ar1.

Here, when the substrate 90 is moved in the horizontal plane during alignment, the liquid-state resist 90$d$ moves slightly in the horizontal plane. In the middle region Ar1 of the substrate 90 illustrated in FIG. 5, movement of the resist 90$d$ in the horizontal plane is not greatly inhibited by the side wall of the kerf KE so that the movement is large. Therefore, relative vibration or the like of the resist on the substrate 90 increases. Accordingly, the movement or vibration of the resist 90$d$ due to the movement of the substrate 90 considerably affects the alignment of the substrate 90 with the template 92, and thus the alignment error increases. On the other hand, in the outer circumferential region Ar2 of the substrate 90 illustrated in FIG. 6, the flowability of the resist 90$d$ in the horizontal plane is considerably inhibited because of the higher side wall of the kerf KE, and thus the vibration or movement of the resist on the substrate 90. Accordingly, since flowing or movement of the resist 90$d$ due to the movement of the substrate 90 rarely affects the alignment of the substrate 90 to the template 92 in this region, the alignment error is reduced.

Figure 7:
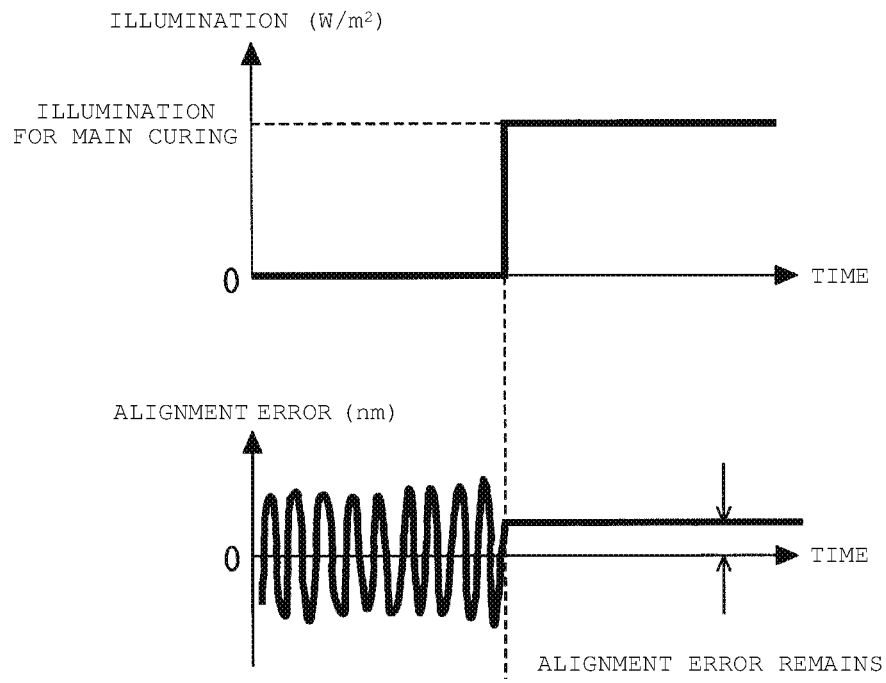
FIG. 7 is a graph illustrating an exposure condition of an exposure light source.
Figure 8:
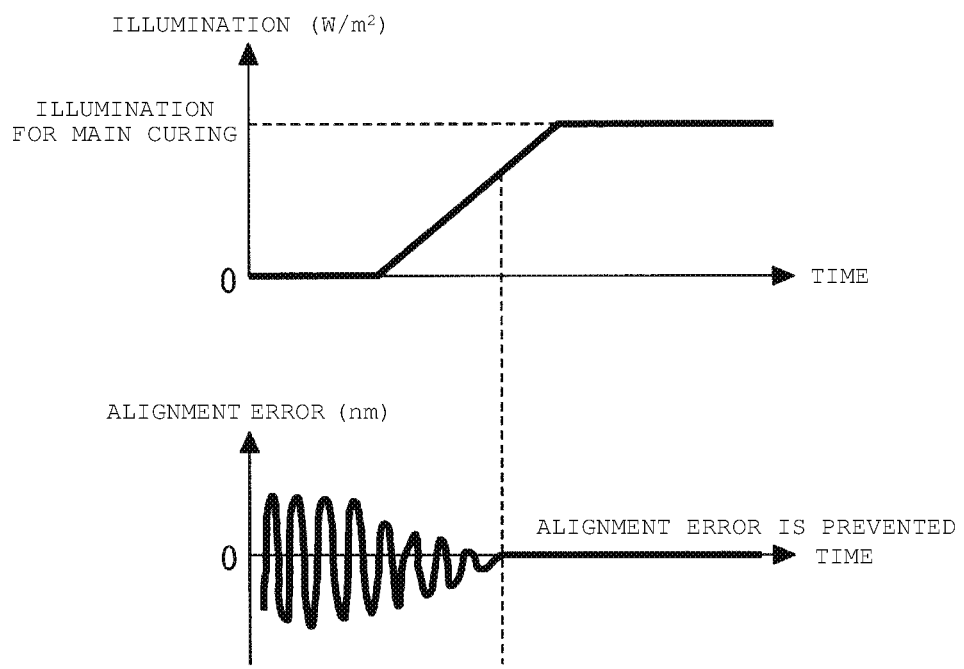
FIG. 8 is a graph illustrating an exposure condition of the exposure light source.

FIGS. 7, 8, and 9 are graphs illustrating exposure condition of the exposure light source 22. The upper drawings of FIGS. 7, 8, and 9 illustrate temporal changes in illumination (W/m$^2$) indicating brightness (intensity) per unit time and unit area of the light from the exposure light source 22. The lower drawings of FIGS. 7, 8, and 9 illustrate temporal changes of an alignment error (nm) between the substrate 90 and the template 92. On the horizontal axis, 0 (that is, the ordinate) indicates a starting time of the alignment. FIG. 7 is an example of an exposure condition according to a comparative example and FIGS. 8 and 9 are examples of exposure conditions according to the embodiment.

When an alignment error before curing of the resist 90$d$ is large, an alignment error after the curing of the resist 90$d$ increases when the illumination of the exposure light source 22 is rapidly increased, to the illumination intensity required for the main curing, after passage of a given time from the start of the alignment, as in the exposure condition illustrated in FIG. 7.

In an exposure condition of the embodiment illustrated in FIG. 8 (hereinafter, referred to as a first exposure condition), emission of light for the temporary curing with illumination weaker in intensity than illumination of the main curing by the exposure light source 22 is started after passage of a given time from the start of the alignment. In the first exposure condition, after the start of the curing light emission, the illumination intensity of the light for the temporary curing is changed over time to be gradually strengthened, i.e., ramped from a non-curing intensity value such as 0 to the full curing intensity value over a period of time at a ramp rate. In the first exposure condition, the light for the temporary curing is emitted with increased intensity over time, and subsequently the light for the main curing is emitted with constant intensity. In this way, the controller 24 executes the main curing on the resist 90d after the temporary curing of the resist 90d so that the hardness of the resist 90d is gradually increased to gradually decrease the fluidity of the resist by controlling the exposure light source 22 based on the first exposure condition. Further, because the resist is hardening, but still somewhat fluid, the relative vibration of the substrate 90 to the template 92 converges under control of the controller 24 in a short time to gradually decrease the alignment error during the temporary curing by aligning the substrate 90 with the template 92 while the resist 90d is subjected to the temporary curing. As a result, exposure error where the resist 90d can easily flow or move on the substrate 90 is significantly reduces. Accordingly, the first exposure condition in FIG. 8 is associated with the middle region Ar1 of the substrate 90 in which the alignment error before the curing of the resist 90d is otherwise large.

In an exposure condition of the embodiment illustrated in FIG. 9 (hereinafter, referred to as a second exposure condition), after passage of a given time from the start of the alignment, emission of the light is started and the light intensity is rapidly increased to the illumination intensity value for the main curing. In this way, the controller 24 executes the main curing on the resist 90d without substantially executing the temporary curing by controlling the exposure light source 22 based on the second exposure condition. Accordingly, the second exposure condition in FIG. 9 is associated with the outer circumferential region Ar2 of the substrate 90 in which the alignment error does not increase even when the resist 90d is rapidly cured.

FIG. 10 is a block diagram illustrating functions of the controller 24. As illustrated in FIG. 10, the controller 24 includes a processing unit 50 and a storage unit 52.

The processing unit 50 is a hardware processor such as a central processing unit (CPU). The processing unit 50 executes various calculation processes by reading programs stored in the storage unit 52. For example, the processing unit 50 functions as a determination unit 53 by reading an exposure condition setting program 57 stored in the storage unit 52. The processing unit 50 functions as a position control unit 54 and an execution unit 56 by reading an imprint program 58 stored in the storage unit 52. Some or all of the determination unit 53, the position control unit 54, and the execution unit 56 may be implemented by hardware such as a circuit including an application specific integrated circuit (ASIC).

The determination unit 53 determines an exposure condition determined in advance for each of the regions Ar1 and Ar2 on the substrate 90, generates an exposure condition database 60, and stores the exposure condition database 60 in the storage unit 52. For example, the determination unit 53 analyzes the likely alignment error for each shot region SA, determines the exposure condition for each of the regions Ar1 and Ar2 of the substrate 90, generates the exposure condition database 60, and stores the exposure condition database 60 in the storage unit 52.

The position control unit 54 adjusts the position of the substrate 90 in the XY plane (that is, the horizontal plane). For example, the position control unit 54 detects the reference mark 16 and sets the reference position of the substrate 90. Based on the reference position, the position control unit 54 controls the driving mechanism 32 to move the substrate 90 such that the shot region SA of the substrate 90 is located below the supply unit 20 or the mesa portion 92b of the template 92. When the mesa portion 92b comes into contact with the resist 90d, the position control unit 54 controls the alignment light sources 17 such that the light for alignment is emitted, and acquires captured images of the substrate mark 90e and the template mark 92d from the detection units 18. The position control unit 54 controls the driving mechanism 32 based on the positions of the reference mark 90e and the template mark 92d specified from the captured images such that the substrate 90 is aligned with the template 92. The position control unit 54 outputs information regarding the position of the substrate 90 to the execution unit 56.

The execution unit 56 executes various kinds of control based on positional information of the substrate 90 acquired from the position control unit 54. Specifically, the execution unit 56 controls the supply unit 20 while the shot region SA of the substrate 90 faces the supply unit 20, such that the resist 90d is dropped and applied to the shot region SA. The execution unit 56 controls the pressing member 44 while the shot region SA of the substrate 90 faces the mesa portion 92b, such that the mesa portion 92b is brought into contact with and pressed into the resist 90d.

The execution unit 56 controls the exposure light source 22 while the mesa portion 92b is in contact with and pressed into the resist 90d, such that the resist 90d is cured. Specifically, the execution unit 56 specifies the regions Ar1 and Ar2 in the substrate 90 where the shot regions SA exist, based on the reference position of the substrate 90 set by the reference mark 16 and the movement distance of the driving mechanism 32. The execution unit 56 extracts the exposure condition associated with one of the specified regions Ar1 and Ar2 of the substrate 90 from the exposure condition database 60 stored in the storage unit 52. The execution unit 56 controls the exposure light source 22 based on the exposure condition such that the main curing is executed after the resist 90d is temporarily cured or the main curing is executed on the resist 90d without substantially executing the temporary curing.

The storage unit 52 includes memories such as a random access memory (RAM) and a read-only memory (ROM), a solid state drive (SSD), a hard disk drive (HDD), and the like. The storage unit 52 may be a storage device connected to the processing unit 50 via a network and provided exteriorly thereof. The storage unit 52 stores a program executed by the processing unit 50, a parameter necessary to execute the program, data generated in execution of the program, and the like. The storage unit 52 stores, for example, the exposure condition setting program 57 and the imprint program 58. The storage unit 52 stores the exposure condition database 60 generated in execution of the exposure condition setting program 57, that is, the exposure condition database 60 necessary for executing the imprint program 58. The storage unit 52 temporarily stores captured images of the marks 90e and 92d, generates, in execution of the imprint program 58, data of the reference position of the substrate 90 and the like.

FIG. 11 is a table illustrating an example of the exposure condition database 60. As illustrated in FIG. 11, in the exposure condition database 60, the regions Ar1 and Ar2 in the substrate 90 where the shot regions SA to be exposed exist are associated with one of a plurality of exposure conditions. For example, the middle region Ar1 of the substrate 90 is associated with the first exposure condition illustrated in FIG. 8. In addition, the outer circumferential region Ar2 of the substrate 90 is associated with the second exposure condition illustrated in FIG. 9. Each exposure condition may be data in which time is associated with illumination control information for controlling illumination intensity. For example, each exposure condition may be data in which the time from an alignment start time is associated with the illumination control information such as a voltage applied to the exposure light source 22 to control the illumination intensity. The illumination control information may be an illumination intensity values and timing for the application thereof. In this case, a database in which the illumination intensity value and timing is associated with the control information for controlling the exposure light source 22 is stored in the storage unit 52.

Accordingly, when the middle region Ar1 of the substrate 90 is exposed, the execution unit 56 extracts the first exposure condition associated with the middle region Ar1 of the substrate 90 from the exposure condition database 60 and controls the exposure light source 22 such that the resist 90d is exposed. When the outer circumferential region Ar2 of the substrate 90 is exposed, the execution unit 56 extracts the second exposure condition associated with the outer circumferential region Ar2 of the substrate 90 from the exposure condition database 60 and controls the exposure light source 22 such that the resist 90d is exposed.

Next, a method of generating the exposure condition database 60 will be described. FIG. 12 is a flowchart illustrating an exposure condition setting process executed by the determination unit 53 of the controller 24.

In the exposure condition setting process, the determination unit 53 causes the position control unit 54 and the execution unit 56 to execute an imprint process of forming the pattern on each shot region SA on the substrate 90 in an experiment conducted to set the exposure condition (S102). The imprint process will be described below. In this imprint process, the main curing is executed on the resist 90d without executing the temporary curing to form the pattern.

The determination unit 53 analyzes the resulting alignment error of each shot region SA on the substrate 90 (S104). For example, the determination unit 53 acquires images of the marks 90e and 92d, after the resist 90d is subjected to the main curing, from the detection units 18 and detects an alignment error of the resulting cured pattern in the resist 90d from position deviations of the marks 90e and 92d. The determination unit 53 may detect the amplitude of the alignment error during the alignment along with the alignment error after the main curing. The determination unit 53 may analyze the alignment error by comparing the alignment error to a preset threshold error. In this case, the determination unit 53 classifies the shot region SA where the alignment error is greater than a threshold error as the middle region Ar1. On the other hand, the determination unit 53 classifies the region where the alignment error is less than the threshold error as the outer circumferential region Ar2. The determination unit 53 sets the exposure condition at each position (here, the middle region Ar1 or the outer circumferential region Ar2) of each of the classified shot regions SA on the substrate 90, generates the exposure condition database 60, and stores the exposure condition database 60 in the storage unit 52 (S106). In this way, the determination unit 53 ends the exposure condition setting process.

Next, an imprint method by the imprint apparatus 10 will be described. FIG. 13 is a flowchart of the imprint process executed by the position control unit 54 and the execution unit 56 of the controller 24.

In the imprint process, the position control unit 54 and the execution unit 56 drop and apply the resist 90d to the shot region SA on the substrate 90 (S202). For example, the position control unit 54 sets the reference position of the substrate 90 based on the position of the reference mark 16. Based on the reference position of the substrate 90, the position control unit 54 controls the driving mechanism 32 to move the substrate 90 such that the shot region SA for application of the resist is located below the supply unit 20. The execution unit 56 controls the supply unit 20 such that the resist 90d is dropped and applied to the shot region SA.

As illustrated in FIG. 1, the position control unit 54 aligns the position of the substrate 90 so that the mesa portion 92b and the shot region SA of the substrate 90 to which the resist 90d is applied substantially face each other by controlling the driving mechanism 32 to move the substrate 90 based on the reference position of the substrate 90 (S204).

As illustrated in FIG. 2, the execution unit 56 controls the pressing member 44 such that the template 92 is moved to pressing the mesa portion 92b into the resist 90d to imprint the pattern 92e of the mesa portion 92b into the resist 90d (S206).

The position control unit 54 aligns the substrate 90 with the template 92 while the mesa portion 92b is pressed into the resist 90d (S208). For example, the position control unit 54 acquires the captured images of the substrate mark 90e and the template mark 92d from the detection units 18 in a state where the alignment light sources 17 are turned on and emit light. Based on the captured images, the position control unit 54 controls the driving mechanism 32 to move the substrate 90 such that the substrate 90 is aligned with the template 92.

The execution unit 56 specifies the position of the shot region SA pressurized by the mesa portion 92b in the substrate 90 based on the reference position of the substrate 90 and the movement distance of the substrate 90 by the driving mechanism 32 (S210).

The execution unit 56 extracts the exposure condition associated with the specified position of the shot region SA from the exposure condition database 60 (S212).

The execution unit 56 controls the exposure light source 22 based on the extracted exposure condition such that the resist 90d is exposed and cured with the light for exposure emitted from the exposure light source 22 (S214). For example, when the position of the shot region SA is specified as the middle region Ar1 of the substrate 90, the execution unit 56 gradually raises the illumination intensity value of the light of the exposure light source 22 as illustrated in FIG. 8 based on the first exposure condition, executes the temporary curing of the resist 90d, and subsequently executes the main curing of the resist 90d. In this case, the position control unit 54 continuously aligns the substrate 90 with the template 92 during the execution of the temporary curing to correct the relative position of the template 92 and substrate 90 while acquiring the captured images of the marks 90e and 92d a plurality of times while detecting position deviation. On the other hand, when the position of the shot region SA is specified as the outer circumferential region Ar2 of the substrate 90, the execution unit 56 rapidly raises the illumination intensity value of the light of the exposure light source 22 up to the full illumination intensity value for the main curing as in the second exposure condition illustrated in FIG. 9 and executes the main curing on the resist 90d. Thus, the pattern 92e of the mesa portion 92b is transferred into the resist 90d to be formed.

The execution unit 56 then controls the pressing member 44 such that the mesa portion 92b is separated from the resist 90d (S216).

Thereafter, the execution unit 56 repeats the processes subsequent to step S202 to form the pattern 92e in all of the shot regions SA on the substrate 90. In this way, the imprint process ends.

As described above, in the imprint apparatus 10, the execution unit 56 of the controller 24 controls the exposure light source 22 based on the exposure condition determined in advance and indicated by the exposure condition database 60 such that the resist 90d is selectively subjected to temporary curing and subsequently subjected to the main curing based on the flow conditions of the resist based on the topography of the substrate. Thus, the imprint apparatus 10 can align the substrate 90 with the template 92 during the temporary curing. Therefore, even when the alignment error can easily increase, it is possible to improve superimposition accuracy by preventing the alignment error while causing the relative vibration of the resist 90b on the substrate 90 with respect to the template 92 to converge to a small value or 0 in a short time. As a result, the imprint apparatus 10 can reduce manufacturing cost and improve a yield of semiconductor devices manufactured after the pattern is formed.

In the imprint apparatus 10, the execution unit 56 of the controller 24 controls the exposure light source 22 based on the exposure conditions associated with the regions (for example, the middle region Ar1 and the outer circumferential region Ar2) of the substrate 90. Thus, the imprint apparatus 10 can cure the resist 90d depending on the different flowability or motion of the resist 90d which is inherently different in each region. For example, the imprint apparatus 10 executes the temporary curing on the resist 90d while executing the alignment in a region in which the flowability or motion of the resist 90d is large and thus an alignment error would otherwise easily occur (for example, the middle region Ar1) based on the first exposure condition, and subsequently executes the main curing on the resist 90d, and thus it is possible to prevent the alignment error between the substrate 90 and the template 92 during cure. On the other hand, the imprint apparatus 10 cures the resist 90d based on the second exposure condition more quickly than based on the first exposure condition in a region in which the flowability or motion of the resist 90d is small and the alignment error rarely occurs (for example, the outer circumferential region Ar2), and thus it is possible to shorten the time needed for forming the pattern.

In the imprint apparatus 10, the execution unit 56 of the controller 24 executes the temporary curing on the resist 90d with an illumination intensity initially weaker than the illumination intensity value for the main curing. Thus, the imprint apparatus 10 can execute the temporary curing on the resist 90d more reliably.

In the imprint apparatus 10, the execution unit 56 of the controller 24 executes the temporary curing on the resist 90d by continuously increasing the illumination intensity of the light of the exposure light source 22 up to the main curing intensity value. Thus, the imprint apparatus 10 can improve the hardness as the alignment of the template 92 to the substrate 90 is progressing. Therefore, it is possible to further prevent the alignment error.

In the imprint apparatus 10, the execution unit 56 of the controller 24 controls the time from the start of the alignment of the substrate 90 with the template 92 to the start of the exposure based on the exposure conditions to be executed. Thus, the imprint apparatus 10 can start the exposure at an appropriate time at which the alignment time can be ensured.

In the imprint apparatus 10, the execution unit 56 of the controller 24 executes the temporary curing on the resist 90d during the alignment. Therefore, it is possible to reduce the alignment error between the substrate 90 and the template 92 during the temporary curing.

Next, modification examples in which the above-described exposure conditions are changed will be described. First to fourth modification examples are assumed to be modification examples of the first exposure condition and a fifth modification example is assumed to be a modification example of the second exposure condition, but the modification examples may be appropriately changed.

First Modification Example

Figure 14:
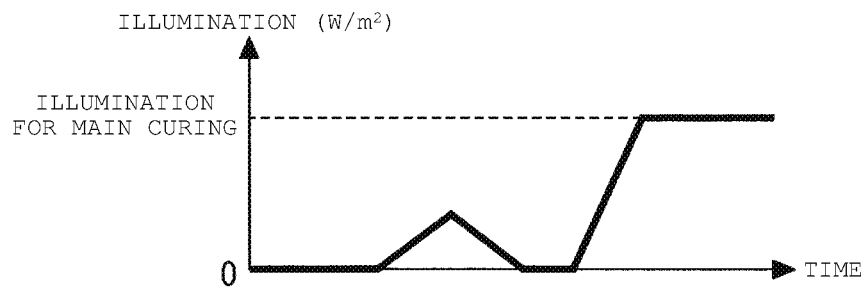
FIG. 14 is a graph illustrating an exposure condition according to a first modification example.

FIG. 14 is a graph illustrating an exposure condition according to the first modification example. The execution unit 56 of the controller 24 may control the exposure light source 22 based on the exposure condition illustrated in FIG. 14 such that the exposure light source 22 temporarily emits light to execute the temporary curing of the resist 90d and thereafter emits the light for the main curing. Specifically, the controller 24 gradually increases the light intensity and causes the exposure light source 22 to emit light with illumination weaker than the light intensity for the main curing. Thereafter, the controller 24 gradually weakens the light intensity until the light is turned off and thus causes the resist 90d to be subjected to the temporary curing. After the light is turned off, the controller 24 gradually strengthens the light intensity again and causes the exposure light source 22 to emit the light intensity value for the main curing so that the resist 90d is subjected to the main curing.

Second Modification Example

Figure 15:
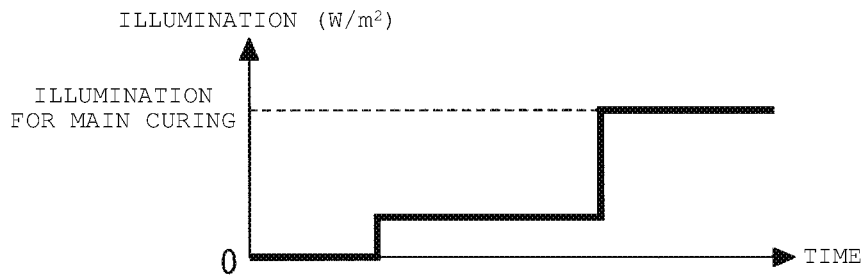
FIG. 15 is a graph illustrating an exposure condition according to a second modification example.

FIG. 15 is a graph illustrating an exposure condition according to the second modification example. The execution unit 56 of the controller 24 controls the exposure light source 22 based on the exposure condition illustrated in FIG. 15 such that the exposure light source 22 emits light with illumination intensity values in a plurality of steps to execute the temporary curing and the main curing on the resist 90d. Specifically, the controller 24 causes the exposure light source 22 to emit light for the temporary curing which has a fixed illumination intensity value weaker than the light for the main curing to execute the temporary curing on the resist 90d while maintaining the illumination intensity value at a fixed value. The controller 24 causes the exposure light source 22 to emit the light for the temporary curing for a time determined in advance, and subsequently causes the exposure light source 22 to emit the light intensity value for the main curing to execute the main curing on the resist 90d.

Third Modification Example

Figure 16:
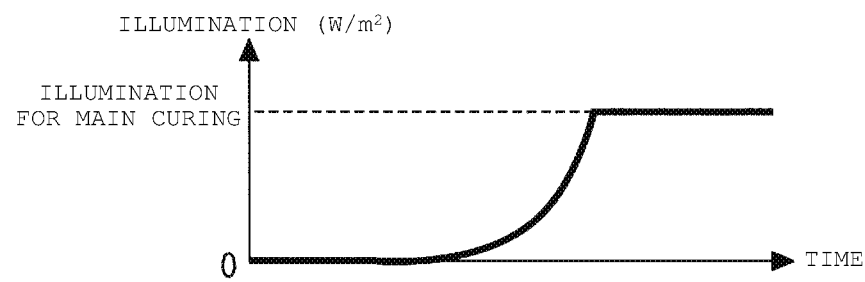
FIG. 16 is a graph illustrating an exposure condition according to a third modification example.

FIG. 16 is a graph illustrating an exposure condition according to the third modification example. The execution unit 56 of the controller 24 controls the exposure light source 22 based on the exposure condition illustrated in FIG. 16 such that the exposure light source 22 emits the light for the temporary curing while gradually changing the emission intensity to execute the temporary curing on the resist 90d. Specifically, the controller 24 causes the exposure light source 22 to emit the light for the temporary curing while gradually non-linearly increasing the emission strength to execute the temporary curing on the resist 90d, and subsequently causes the exposure light source 22 to emit the light value for the main curing to execute the main curing on the resist 90d.

Fourth Modification Example

Figure 17:
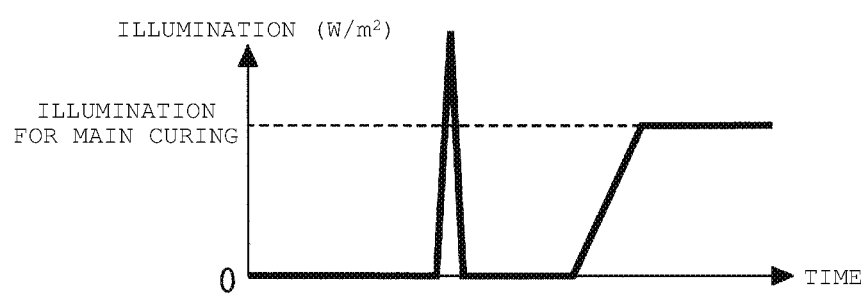
FIG. 17 is a graph illustrating an exposure condition according to a fourth modification example.

FIG. 17 is a graph illustrating an exposure condition according to the fourth modification example. The execution unit 56 of the controller 24 controls the exposure light source 22 based on the exposure condition illustrated in FIG. 17 such that the exposure light source 22 emits light having an intensity greater than the light intensity for the main curing for an emission time shorter than the emission time of the main curing to execute the temporary curing on the resist 90d. In other words, the execution unit 56 controls the exposure light source 22 such that an area of the light for the temporary curing in the graph of FIG. 17 is smaller than an area of the light for the main curing. The area of the light herein is a value obtained by integrating the illumination with respect to time and is a value corresponding to an amount of light from the exposure light source 22. Specifically, the controller 24 causes the exposure light source 22 to emit light with the illumination intensity greater than that of the light intensity for the main curing to execute the temporary curing on the resist 90d for a time in which the resist 90d is not subjected to the main curing, and subsequently causes the exposure light source 22 to gradually weaken the light intensity until the light is turned off. Thereafter, after executing the alignment, the controller 24 causes the exposure light source 22 to emit the light intensity value for the main curing to execute the main curing on the resist 90d. Thus, the imprint apparatus 10 can shorten an emission time necessary for the temporary curing and shorten a time necessary for forming the pattern.

Fifth Modification Example

Figure 18:
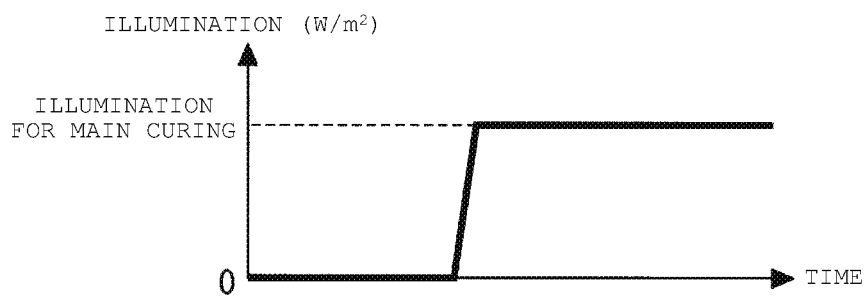
FIG. 18 is a graph illustrating an exposure condition according to a fifth modification example.

FIG. 18 is a graph illustrating an exposure condition according to the fifth modification example. The controller 24 controls the exposure light source 22 based on the exposure condition illustrated in FIG. 18 such that the illumination intensity of the light is gradually strengthened even in the region in which the alignment error is small. Here, the controller 24 causes the exposure light source 22 to gradually increase the illumination intensity of the light with the temporal change, i.e., ramp rate, of the illumination intensity of the light in the second exposure condition to be greater than the temporal change of the illumination of the light in the first exposure condition.

The functions, the connection relations, and the number of configurations according to the above-described embodiment may be appropriately changed. The procedure of the flowchart in the above-described embodiment may be appropriately changed.

In the above-described embodiment, for example, the imprint apparatus 10 includes the determination unit 53 that sets the exposure conditions, but the determination unit 53 may be provided in another apparatus. In this case, the storage unit 52 stores the exposure condition database 60 set in advance by the determination unit 53.

In the above-described embodiment, for example, the determination unit 53 forms the pattern on the substrate 90 for an experiment and sets the exposure conditions, but the setting of the exposure conditions is not limited thereto. For example, the determination unit 53 may form a pattern in the substrate 90 in which a circuit pattern or the like is actually generated and which is not for an experiment and may set exposure conditions or update the exposure conditions by machine learning such as deep learning. In this case, the position control unit 54 and the execution unit 56 form a pattern based on the exposure conditions updated in a previous pattern forming process on the substrate 90.

In the above-described embodiment, for example, the exposure condition database 60 includes two exposure conditions associated with the regions on the substrate 90, but the exposure condition database 60 is not limited thereto. For example, the exposure condition database may include three or more exposure conditions. Alternatively, the exposure condition database may include only one exposure condition. When one exposure condition is used, it is possible to reduce the alignment error, for example, by adopting the exposure condition in which the resist 90d can be subjected to the temporary curing to all the regions of the substrate 90, as illustrated in FIG. 8.

In the above-described embodiment, for example, the determination unit 53 determines the exposure condition determined in advance for each region of the substrate 90 and generates the exposure condition database 60, but a method of generating the exposure condition database 60 is not limited thereto. For example, the determination unit 53 may generate a plurality of exposure conditions based on the alignment error or the like and determine the exposure condition for each region of the substrate 90.

In the above-described embodiment, in the exposure condition database 60, the exposure condition is associated with each of the middle region Ar1 and the outer circumferential region Ar2 of the substrate 90, but the exposure condition database 60 is not limited thereto. For example, in the exposure condition database 60, each shot region SA may be associated with the exposure condition. In the exposure condition database 60, the shape of the surface of the substrate 90 including the depth DP or the like of the kerf KE may be associated with the exposure condition. In this case, the controller 24 may detect the shape of the surface of the substrate 90, extract the exposure condition from the exposure condition database 60, and control the exposure light source 22.

In the above-described embodiment, for example, the controller 24 controls the exposure light source 22 such that the illumination intensity value of the light is controlled, but the control of the illumination of the light is not limited thereto. For example, the controller 24 may control the aperture 23 based on the exposure condition such that the total illumination intensity value of the light is controlled.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint method, comprising:
    positioning a patterned mesa portion of a template above a first shot area of a substrate, the substrate having a transfer target material in the first shot area and a second shot area of the substrate, the first and second shot areas being in different regions of the substrate that do not overlap;
    pressing the patterned mesa portion into the transfer target material in the first shot area;
    setting exposure conditions for the transfer target material in the first shot area;
    exposing the first shot area with an exposure light source using an exposure intensity profile and exposure timing based on the set exposure conditions for the first shot area to cure the transfer target material in the first shot area;
    separating the template from the first shot area of the substrate while leaving a first patterned region in the first shot area;
    after separating the template, positioning the patterned mesa portion of the template above the second shot area;
    after positioning the patterned mesa portion of the template above the second shot area, pressing the patterned mesa portion into the transfer target material in the second shot area;
    setting exposure conditions for the transfer target material in the second shot material;
    after pressing the patterned mesa portion into the transfer target material in the second shot area, exposing the second shot area with the exposure light source using an exposure intensity profile and exposure timing based on the set exposure conditions for the second shot area to cure the transfer target material in the second shot areas; and
    separating the template from the second shot area of the substrate while leaving a second patterned region in the second shot area, wherein
    the exposure conditions for the transfer target material in a central portion of the first shot area are different from the exposure conditions for the transfer target material in a central portion of the second shot area, the central portions of the first shot area and the second shot area being non-overlapping, and
    the first and second shot areas each individually have a planar area at least equal to a planar area of the patterned mesa portion of the template.

2. The imprint method according to claim 1, wherein the first and second shot areas are separated from each other on the substrate by at least one other shot area that is separately exposed from either of the first or second shot areas.

3. The imprint method according to claim 1, wherein the exposure conditions for the transfer target material in the first shot area are retrieved from a database while the patterned mesa portion of the template is being rough aligned with the first shot area.

4. The imprint method according to claim 1, wherein the exposure conditions for the transfer target material in the first shot area include a partial curing phase.

5. The imprint method according to claim 4, further comprising:
    performing a fine alignment process for aligning the patterned mesa portion and the first shot area during the partial curing phase.

6. The imprint method according to claim 5, wherein an intensity of light from the exposure light source changes during the partial curing phase according to the set exposure conditions for the first shot area.

7. The imprint method according to claim 6, wherein the change in the intensity of light during the partial curing phase comprises ramping the light intensity from a low value to a higher main curing value.

8. The imprint method according to claim 7, wherein the light intensity during the ramping increases linearly.

9. The imprint method according to claim 7, wherein the light intensity during the ramping increases non-linearly.

10. The imprint method according to claim 5, wherein the substrate is moved during the partial curing phase.

11. The imprint method according to claim 4, wherein the exposure conditions for the first target area include a set delay time from pressing the patterned mesa portion of the template into contact with the transfer target material until exposure initiation for the partial curing phase.

12. The imprint method according to claim 4, wherein the change in intensity of light during the partial curing phase comprises increasing the intensity of the light to a value greater than the intensity for a main curing phase of the transfer target material and then reducing the intensity of the light to zero.

13. The imprint method according to claim 1, wherein the wavelengths of light used for exposing the first shot area are the same as used for exposing the second shot area.

14. The imprint method according to claim 1, further comprising:
    after separating the template from the second shot area, pressing the patterned mesa portion into the transfer target material in a third shot area of the substrate.

15. The imprint method according to claim 1, wherein the substrate is a silicon wafer, and
    the first shot area is nearer a center point of the substrate than is the second shot area.

16. The imprint method according to claim 1, wherein the setting of exposure conditions for the transfer target material in the second shot area includes changing an output intensity of the exposure light source at the exposure light source.

17. The imprint method according to claim 1, wherein the exposure conditions for the transfer target material in the central portion of the first shot area include a total light emission time from the exposure light source that is different from a total light emission time for the transfer target material in the central portion of the second shot area.

18. The imprint method according to claim 1, wherein the exposure conditions are the same for the central portion of the second shot area and an outermost edge portion of the second shot area.

* * * * *